United States Patent

Wei et al.

[11] Patent Number: 5,966,628
[45] Date of Patent: Oct. 12, 1999

[54] PROCESS DESIGN FOR WAFER EDGE IN VLSI

[75] Inventors: Zin-Chein Wei, Hsin-Chu; Yuh-Jier Mii, Taipei, both of Taiwan

[73] Assignee: Taiwan Semiconductor Manufacturing Company, Ltd., Hsin-Chu, Taiwan

[21] Appl. No.: 09/023,050

[22] Filed: Feb. 13, 1998

[51] Int. Cl.$^6$ .................................................. H01L 21/20
[52] U.S. Cl. ........................ 438/584; 438/598; 438/599
[58] Field of Search .................... 438/584, 598, 438/599

[56] References Cited

U.S. PATENT DOCUMENTS

| | | | |
|---|---|---|---|
| 4,510,176 | 4/1985 | Cuthbert et al. | 427/82 |
| 5,168,201 | 12/1992 | Arai et al. | 430/22 |
| 5,366,906 | 11/1994 | Wojnarowski et al. | 438/598 |
| 5,370,766 | 12/1994 | Desaigoudar et al. | 438/584 |
| 5,425,846 | 6/1995 | Koze et al. | 156/646.1 |
| 5,556,506 | 9/1996 | Contreras et al. | 438/584 |
| 5,578,532 | 11/1996 | Van De Ven et al. | 438/584 |
| 5,580,829 | 12/1996 | Browning et al. | 438/584 |
| 5,714,396 | 2/1998 | Robb et al. | 438/584 |

*Primary Examiner*—John F. Niebling
*Assistant Examiner*—Lynne A. Gurley
*Attorney, Agent, or Firm*—George O. Saile; Stephen B. Ackerman; Larry J. Prescott

[57] ABSTRACT

A wafer structure and method of forming a wafer structure with all of the dielectric material and conducting material films removed from the outer periphery of the wafer in order to protect the dielectric and conducting films from damage due to wafer handling, storage, or clamping. The dielectric or conducting material is removed from the wafer edge using wafer edge exposure or edge bead rinse methods. The wafer edge exposure method is carried out at the same time the dielectric or conducting layer is being patterned.

11 Claims, 4 Drawing Sheets

5,966,628

PROCESS DESIGN FOR WAFER EDGE IN VLSI

BACKGROUND OF THE INVENTION (1) Field of the Invention

This invention relates to a wafer structure and method of forming a wafer structure where that part of dielectric and conducting films at the outer periphery of a wafer are removed to prevent damage to these films. Wafer edge exposure and edge bead rinse methods are used to remove the dielectric and conducting materials from the wafer edge.

(2) Description of the Related Art

U.S. Pat. No. 5,425,846 to Koze et al. describes a method of removing material from the perimeter of wafers by stacking the wafers and subjecting them to a plasma etch.

U.S. Pat. No. 5,168,021 to Arai et al. describes a method of exposing a peripheral part of a wafer taking account of a correcting angle determined by calculating the amount of misalignment between the center of a wafer and a rotational center for the wafer from the amount of displacement of a sensor detecting a peripheral edge.

U.S. Pat. No. 4,510,176 to Cuthbert et al. describes a method of removing material from the edge of a wafer by directing a jet of solvent at the wafer periphery while the wafer is spinning.

This invention describes a wafer structure and method of achieving a wafer structure with material removed from the outer periphery of the wafer. Wafer edge exposure and edge bead rinse methods are used to remove the material from the wafer edge.

SUMMARY OF THE INVENTION

In the manufacture of integrated circuit wafers it is necessary to handle wafers between and during process steps and to store wafers between process steps. During this handling and storing of wafers, as well as during the actual process steps, wafers can be damaged. This damage is often due to edge damage of films deposited on the wafers. Material films deposited on the wafers often forms a bead at the edge of the wafer and/or coats the edge of the wafer. These edge beads or coatings can become chipped during wafer handling, during storage between process steps, or during wafer clamping during process steps. This chipping can lead to film peeling and can make substantial parts of the wafer unusable.

It is a principle objective of this invention to provide a wafer structure which avoids the problem of film damage at the wafer edge.

It is another principle objective of this invention to provide a method of forming wafers which avoids the problem of film damage at the wafer edge.

These objectives are achieved by a wafer structure and method of achieving a wafer structure which removes the material films from a predetermined region at the edge of the wafer. The wafers are formed so that films are removed from that part of the wafer which will be affected by wafer clamping during subsequent processing steps. The films are removed from the edge of the wafer so that film damage will not occur during handling or storing of wafers between processing steps. The wafer structure is such that the conductor materials are covered by dielectric layers to further protect the layers of conductor materials during storage and handling.

DESCRIPTION OF THE PREFERRED EMBODIMENTS

Figure 1:
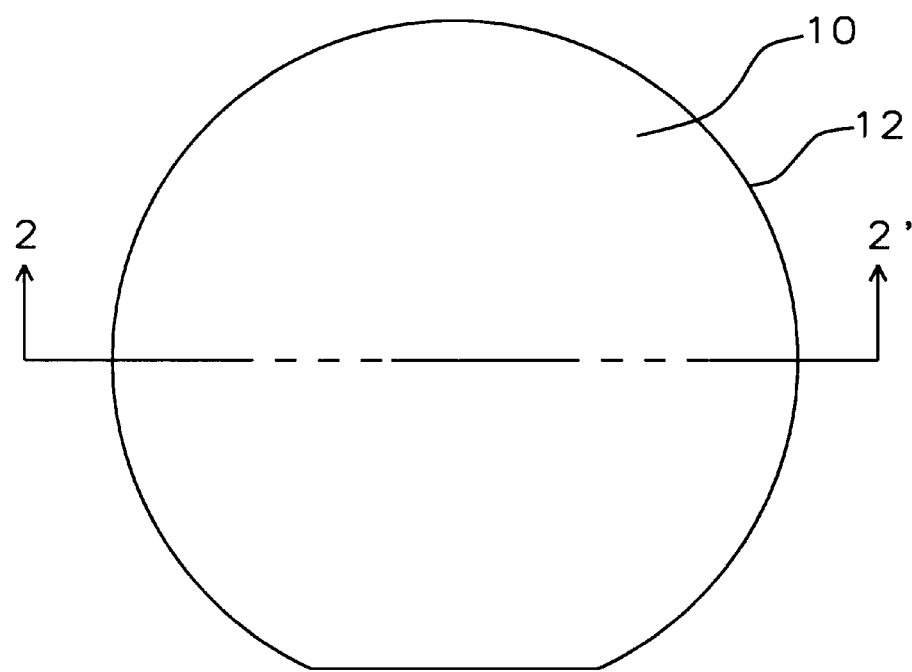
FIG. 1 shows a top view of a semiconductor circuit wafer.
Figure 2:
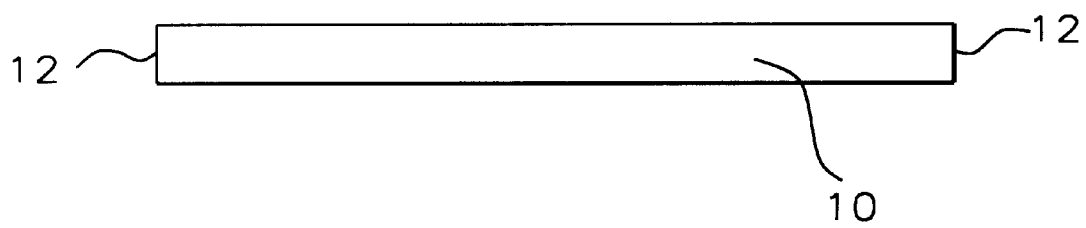
FIG. 2 shows a cross section view of a semiconductor wafer along the line 2—2' of FIG. 1.

Refer now to FIGS. 1–6B for a description of the preferred embodiment of the method of forming the wafer structure of this invention. FIG. 1 shows the top view of a semiconductor wafer 10 with devices formed therein, not shown. The wafer edge 12 is to be kept free of the materials which will be deposited on the wafer. FIG. 2 shows a cross section view of the wafer 10 taken along line 2—2' of FIG. 1. FIG. 3A shows a cross section of the wafer after a layer of first dielectric material 14, such as silicon dioxide or silicon nitride used as a gate dielectric, has been formed on the wafer 10.

Figure 3A:
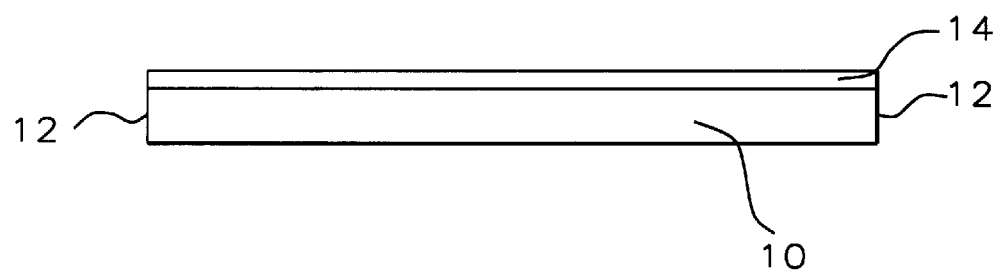
FIG. 3A shows a cross section view of a semiconductor wafer with a layer of first dielectric material formed thereon.
Figure 3B:
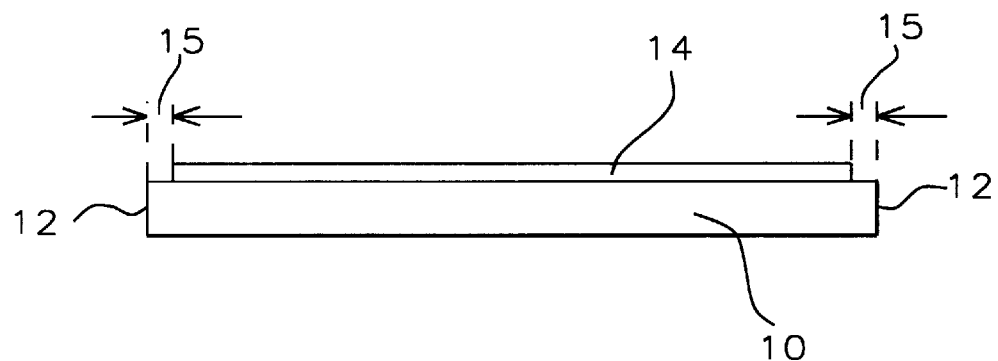
FIG. 3B shows a cross section view of a semiconductor wafer after removing first dielectric material from the edge of the wafer.

As shown in FIG. 3B the first dielectric material 14 within a first distance 15 of the outer periphery 12 of the wafer 10 is removed using a method such as wafer edge exposure, WEE, or edge bead rinse, EBR. The wafer edge exposure method uses a layer of photoresist on the wafer wherein that part of the photoresist within the first distance 15 of the outer periphery 12 of the wafer is exposed. The first dielectric material within the first distance 15 of the outer periphery 12 of the wafer is then etched away using the developed photoresist as a mask. The edge bead rinse method uses a stream of solvent directed at the outer periphery 12 of the wafer to remove the first dielectric material within the first distance 15 of the outer periphery 12 of the wafer. In this example the layer of first dielectric 14 has a thickness of between about 1000 and 2500 Angstroms and the first distance 15 is between about 0.1 and 2.5 millimeters.

Figure 4A:
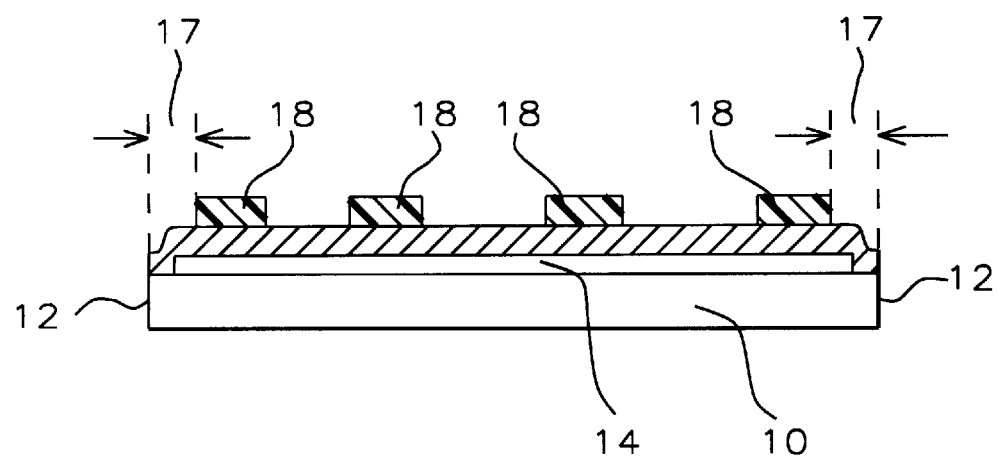
FIG. 4A shows a cross section view of a semiconductor wafer with a layer of conductor material and a photoresist pattern formed thereon.
Figure 4B:
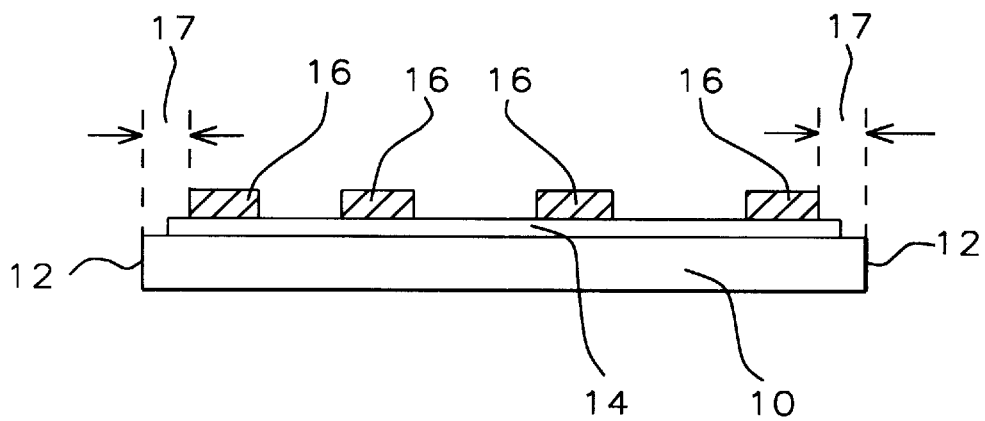
FIG. 4B shows a cross section view of a semiconductor wafer after patterning the layer of first conductor material thereby removing first conductor material from the edge of the wafer.

Next, as shown in FIG. 4A, a layer of first conductor material 16, such as polysilicon or polycide having a thickness of between about 1500 and 3000 Angstroms is formed on the wafer 10. A first photoresist pattern 18 is formed on the layer of first conductor material 16 so that there is no photoresist within a second distance 17 of the outer periphery 12 of the wafer 10, thereby using the wafer edge exposure method. As shown in FIG. 4B, the layer of first conductor material 16 is then patterned, using the first photoresist pattern as a mask and dry anisotropic etching, so that there is no first conductor material remaining within a second distance 17 of the outer periphery 12 of the wafer 10 and the first photoresist mask is removed. The first conductor material is then protected from damage during wafer handling, storage, or clamping. In this example the second distance 17 is between about 2.5 and 3.5 millimeters.

Figure 5A:
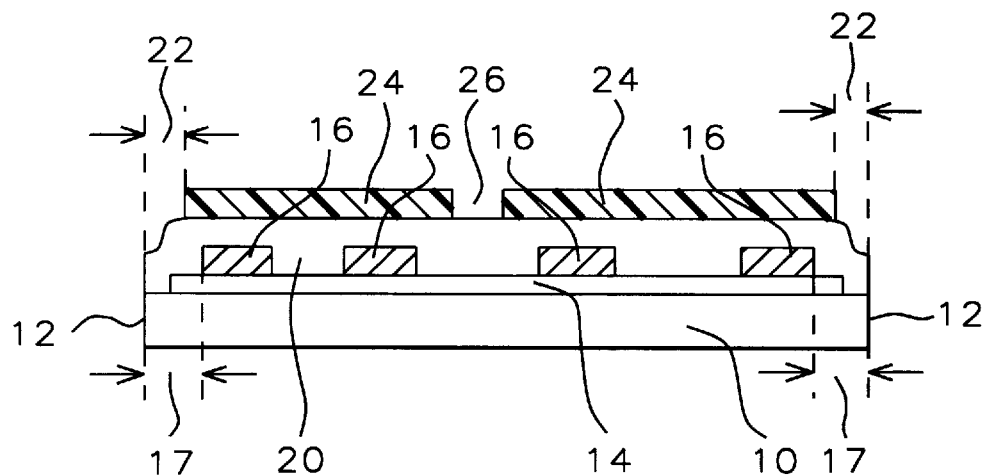
FIG. 5A shows a cross section view of a semiconductor wafer with a layer of second dielectric material formed over the patterned layer of first conductor material and a photoresist pattern formed over the layer of second dielectric material.

Next, as shown in FIG. 5A, a layer of second dielectric material 20, such as silicon dioxide having a thickness of between about 5000 and 9000 Angstroms, is formed over the patterned layer of first conductor material 16. A second photoresist pattern 24, used to form contact holes 26 in the second dielectric material 20, is formed on the layer of second dielectric material 20. The wafer edge exposure method is again used so there is no photoresist within a third distance 22 of the outer periphery 12 of the wafer 10.

Figure 5B:
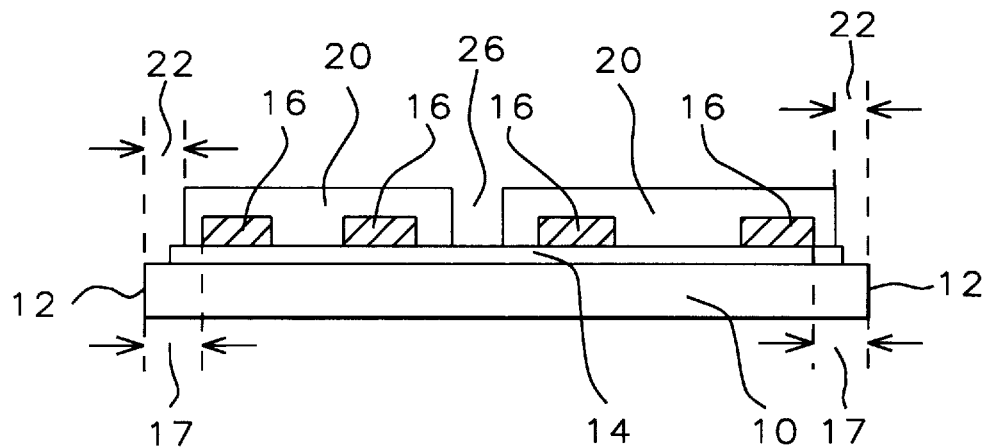
FIG. 5B shows a cross section view of a semiconductor wafer after patterning the layer of second dielectric material thereby removing second dielectric material from the wafer edge.

As shown in FIG. 5B, the layer of second dielectric material 20 is then patterned, using dry anisotropic etching and the second photoresist pattern as a mask, thereby forming contact holes 26 and removing all second dielectric material within a third distance 22 of the outer periphery 12 of the wafer 10. The second photoresist pattern is then removed. As shown in FIG. 5B, the third distance 22 is less than the second distance 17 so that the second dielectric material covers the first conductor material at the outer periphery of the wafer. In this example the third distance is between about 2.2 and 3.3 millimeters. The second dielectric material 20 is then protected from damage during wafer handling, storage, or clamping.

Figure 6A:
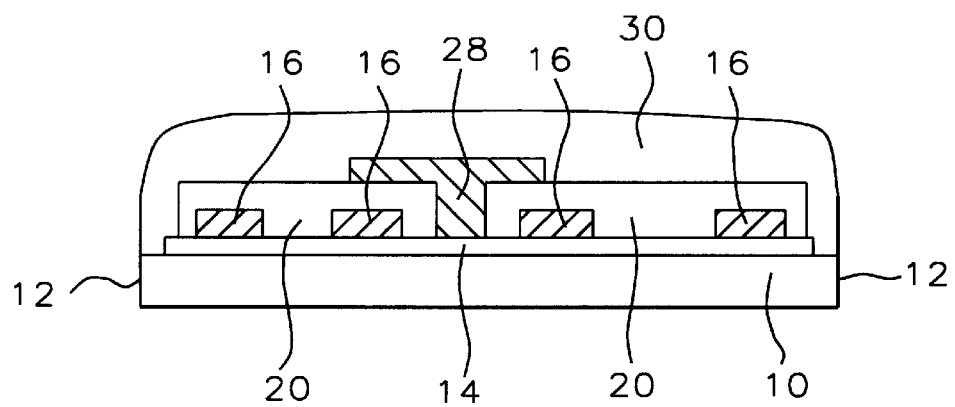
FIG. 6A shows a cross section view of a semiconductor wafer with a layer of third dielectric material formed over the patterned layer of second dielectric material and patterned layer of second conductor material.

As shown in FIG. 6A, a patterned layer of second conductor material 28, such as aluminum copper having a thickness of between about 3000 and 8000 Angstroms is formed on the patterned layer of second dielectric material 20, thereby filling the via holes. A layer of third dielectric material 30, such as silicon dioxide deposited using plasma enhanced deposition of tetra ethyl ortho silicate or spin on glass having a thickness of between about 3000 and 8000 Angstroms, is then formed over the patterned layer of second dielectric material 20 and the patterned layer of second conductor material 28.

Figure 6B:
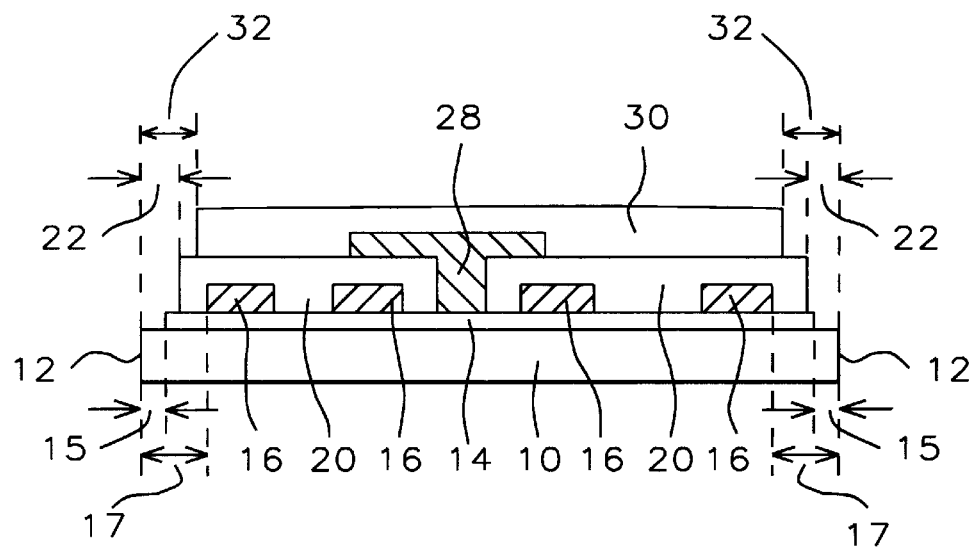
FIG. 6B shows a cross section view of the integrated circuit structure with the first, second, and third dielectric materials and the first conductor material removed from the wafer edge.
Figure 7:
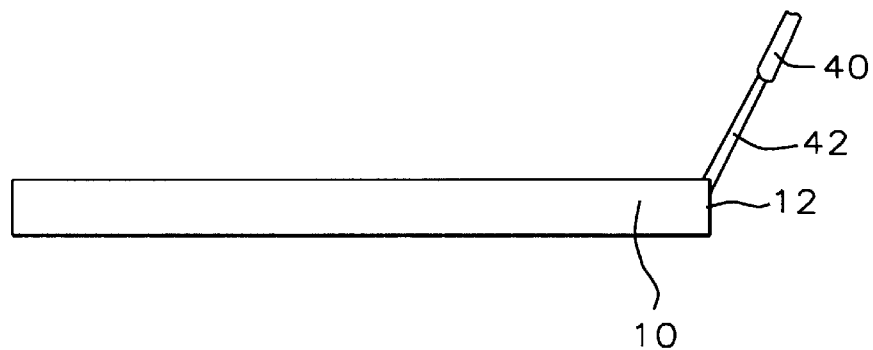
FIG. 7 shows a diagram of removing dielectric material using the edge bead rinse method.

Next, as shown in FIG. 6B, that part of the layer of third dielectric material 28 within a fourth distance 32 of the outer periphery 12 of the wafer is then removed using the edge bead rinse method. In the edge bead rinse method a nozzle 40 directs a stream of solvent 42 at the outer periphery 12 of the wafer 10 as the wafer 10 is rotated, see FIG. 7. The solvent is directed at the outer periphery of the wafer before the third dielectric material, in this example spin on glass, is cured. That part of the third dielectric material within a fourth distance 32 of the outer periphery 12 of the wafer is removed, see FIG. 6B. In this example the fourth distance is between about 2.5 and 3.0 millimeters. As shown in FIG. 6B, the fourth distance is greater than the third distance. The third dielectric material 30 is then protected from damage during wafer handling, storage, or clamping.

The preferred embodiment of the completed wafer structure of this invention is shown in FIG. 6B. A layer of first dielectric material 14, such as silicon dioxide having a thickness of between about 1500 and 3000 Angstroms, is formed on a semiconductor wafer 10 having an outer periphery 12. All of the first dielectric material has been removed from the region within a first distance 15 of the outer periphery 12 of the wafer. In this example the first distance is between about 0.1 and 2.5 millimeters. A patterned layer of first conductor material 16, with all of the first conductor material removed from the region within a second distance 17 of the outer periphery 12 of the wafer 10, is formed on the layer of first dielectric material 14. In this example the layer of first conductor material 16 is polysilicon or polycide having a thickness of between about 2500 and 3500 Angstroms and the second distance is between about 2.5 and 3.5 millimeters.

A patterned layer of second dielectric material 20, with contact holes formed therein and all of the second dielectric material removed from the region within a third distance 22 of the outer periphery 12 of wafer, is formed over the patterned layer of first conductor material 16. In this example the second dielectric material is silicon dioxide formed using plasma enhanced deposition of tetra ethyl ortho silicate having a thickness of between about 1000 and 3000 Angstroms and the third distance 22 is between about 2.2 and 3.3 millimeters. As can be seen in FIG. 6B the second distance 17 is greater than the third distance 22.

A patterned layer of second conductor material 28, in this example aluminum copper having a thickness of between about 3000 and 8000 Angstroms, is formed on the patterned layer of second dielectric material 20 thereby filling the contact holes formed in the patterned layer of second dielectric material 20. A layer of third dielectric material 30, such as spin on glass having a thickness of between about 3000 and 6000 Angstroms, is formed over the patterned layer of second dielectric material 20 and the patterned layer of second conductor material 28. All of the third dielectric material 30 has been removed from the region within a fourth distance 32 of the outer periphery 12 of the wafer. In this example the fourth distance 32 is between about 2.5 and 3.0 millimeters. As can be seen in FIG. 6B the fourth distance 32 is greater than the third distance 22. FIG. 6B shows a wafer structure where the dielectric and conducting films formed on the wafer are protected from damage during wafer handling, storage, or clamping.

While the invention has been particularly shown and described with reference to the preferred embodiments thereof, it will be understood by those skilled in the art that various changes in form and details may be made without departing from the spirit and scope of the invention.

What is claimed is:

1. A method of manufacturing integrated circuit wafers, comprising the steps of:
    providing a semiconductor wafer having an outer periphery;
    forming a layer of first dielectric material on said semiconductor wafer;
    removing that part of said first dielectric material within a first distance of said outer periphery of said semiconductor wafer;
    forming a layer of first conductor material on said layer of first dielectric material;
    patterning said layer of first conductor material, thereby removing that part of said layer of first conductor material within a second distance of said outer periphery of said semiconductor wafer;
    forming a layer of second dielectric material on said semiconductor wafer thereby covering said patterned layer of first conductor material;

patterning said layer of second dielectric material, thereby forming contact holes in said layer of second dielectric material and removing that part of said layer of second dielectric material within a third distance of said outer periphery of said semiconductor wafer;

forming a patterned layer of second conductor material on said layer of second dielectric material thereby filling said contact holes formed in said layer of second dielectric material;

forming a layer of third dielectric material on said layer of second dielectric material thereby covering said patterned layer of second conductor material; and removing that part of said layer of third dielectric material within a fourth distance of said outer periphery of said semiconductor wafer.

2. The method of claim 1 wherein said second distance is between about 2.5 and 3.5 millimeters.

3. The method of claim 1 wherein said third distance is between about 2.2 and 3.3 millimeters.

4. The method of claim 1 wherein said fourth distance is between about 2.5 and 3.0 millimeters.

5. The method of claim 1 wherein said fourth distance is greater than said third distance and said second distance is greater than said third distance.

6. The method of claim 1 wherein said patterning said layer of first conductor material, thereby removing that part of said layer of first conductor material within a second distance of said outer periphery of said semiconductor wafer comprises wafer edge exposure of a layer of photoresist.

7. The method of claim 1 wherein said patterning said layer of second dielectric material, thereby forming contact holes in said layer of second dielectric material and removing that part of said layer of second dielectric material within a third distance of said outer periphery of said semiconductor wafer comprises wafer edge exposure of a layer of photoresist.

8. The method of claim 1 wherein said removing that part of said layer of third dielectric material within a fourth distance of said outer periphery of said semiconductor wafer is accomplished using edge bead rinse of said semiconductor wafer.

9. The method of claim 1 wherein said layer of first conductor material is polysilicon having a thickness of between about 1500 and 3000 Angstroms.

10. The method of claim 1 wherein said layer of second dielectric material is silicon dioxide having a thickness of between about 1000 and 9000 Angstroms.

11. The method of claim 1 wherein said layer of third dielectric material is spin on glass having a thickness of between about 3000 and 8000 Angstroms.

* * * * *